(12) United States Patent
Wu (10) Patent No.: US 7,277,907 B2
(45) Date of Patent: Oct. 2, 2007

(54) METHOD OF SETTING A TRANSFER FUNCTION OF AN ADAPTIVE FILTER

(75) Inventor: Gin-Der Wu, Taipei (TW)

(73) Assignee: ALI Corporation, Taipei (TW)

( * ) Notice: Subject to any disclaimer, the term of this patent is extended or adjusted under 35 U.S.C. 154(b) by 723 days.

(21) Appl. No.: 10/708,852

(22) Filed: Mar. 29, 2004

(65) Prior Publication Data

US 2005/0102339 A1 May 12, 2005

(30) Foreign Application Priority Data

Oct. 27, 2003 (TW) .............................. 92129823 A (51) Int. Cl.
*G06F 17/10* (2006.01)
(52) U.S. Cl. ..................................... 708/320
(58) Field of Classification Search ..................... None
See application file for complete search history.

(56) References Cited

U.S. PATENT DOCUMENTS

| | | | | |
|---|---|---|---|---|
| 4,888,789 A | * | 12/1989 | Orban | ........................ 375/230 |
| 5,443,073 A | * | 8/1995 | Wang et al. | ................. 600/526 |
| 5,698,807 A | * | 12/1997 | Massie et al. | ................ 84/661 |
| 6,219,376 B1 | * | 4/2001 | Zhodzishsky et al. | ...... 375/148 |
| 2003/0134607 A1 | * | 7/2003 | Raghavan et al. | .......... 455/132 |

* cited by examiner

*Primary Examiner*—Tan V. Mai
(74) *Attorney, Agent, or Firm*—Winston Hsu (57) ABSTRACT

A method of setting a transfer function of an adaptive filter. The adaptive filter is used for processing an audio signal. The method includes setting a first, a second, and a third pole, setting a first zero without resting upon the audio signal. A real part of the first zero is a negative value and an imaginary part of the first zero is a positive value. A second zero is set having a real part corresponding a positive value and an imaginary part corresponding to a negative value and a third zero is set according to a key shifting associated with the audio signal.

8 Claims, 7 Drawing Sheets

METHOD OF SETTING A TRANSFER FUNCTION OF AN ADAPTIVE FILTER

BACKGROUND OF INVENTION

1. Field of the Invention

The invention relates to a method of controlling an adaptive filter, and more particularly, to a method of setting a transfer function of an adaptive filter.

2. Description of the Prior Art

With the development of science and technology, types of entertainment are getting more and more varied. For example, an accompaniment system can play the background music of songs allowing users to sing without a real band, providing a specialized form entertainment. For the requirement of the accompaniment system, background music without vocals are sold while the songs with vocals are also published. Users can then sing with the accompaniment system after listening the songs.

Figure 1:
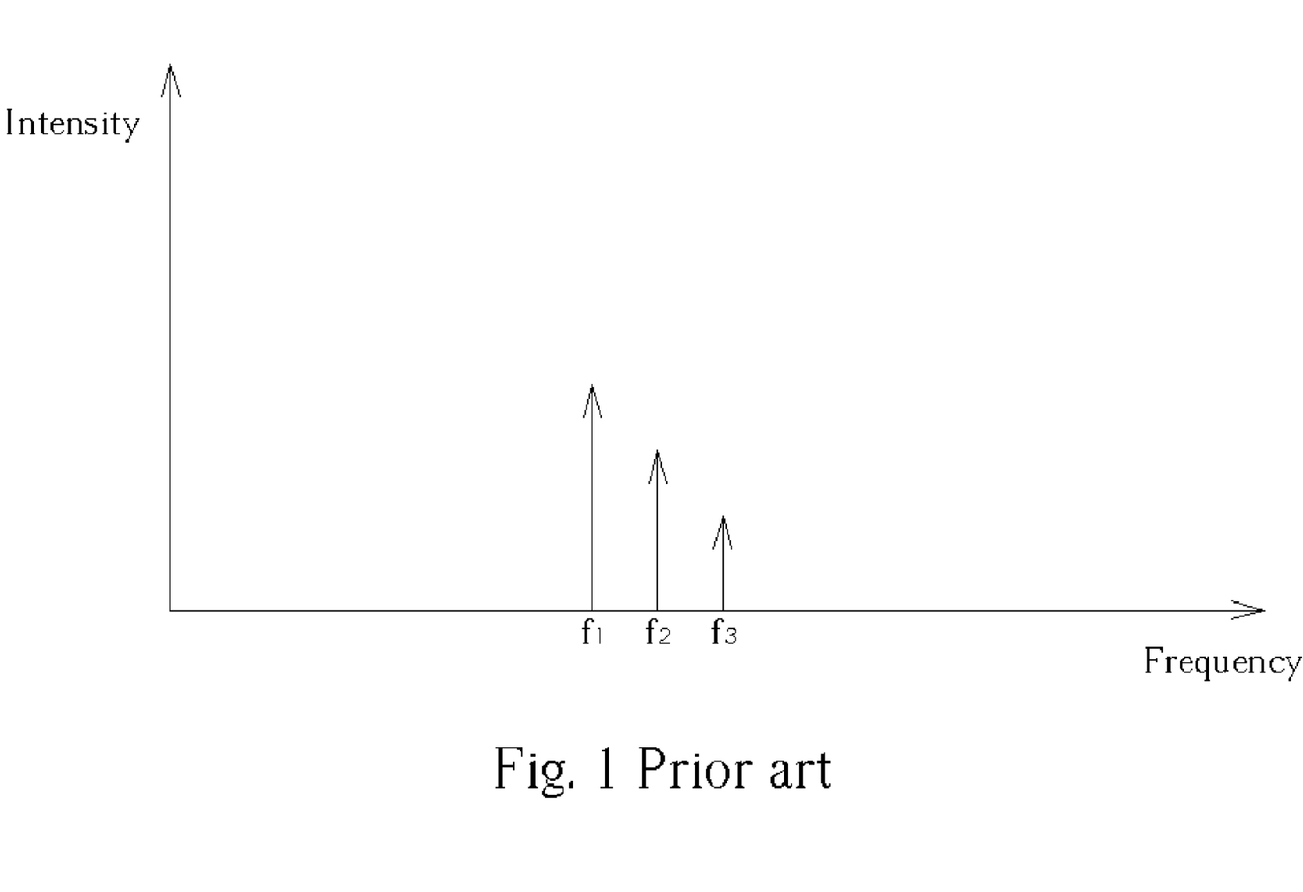
FIGS. 1, 2, and 3 are schematic diagrams of a key shifting operation according to the prior art.
Figure 2:
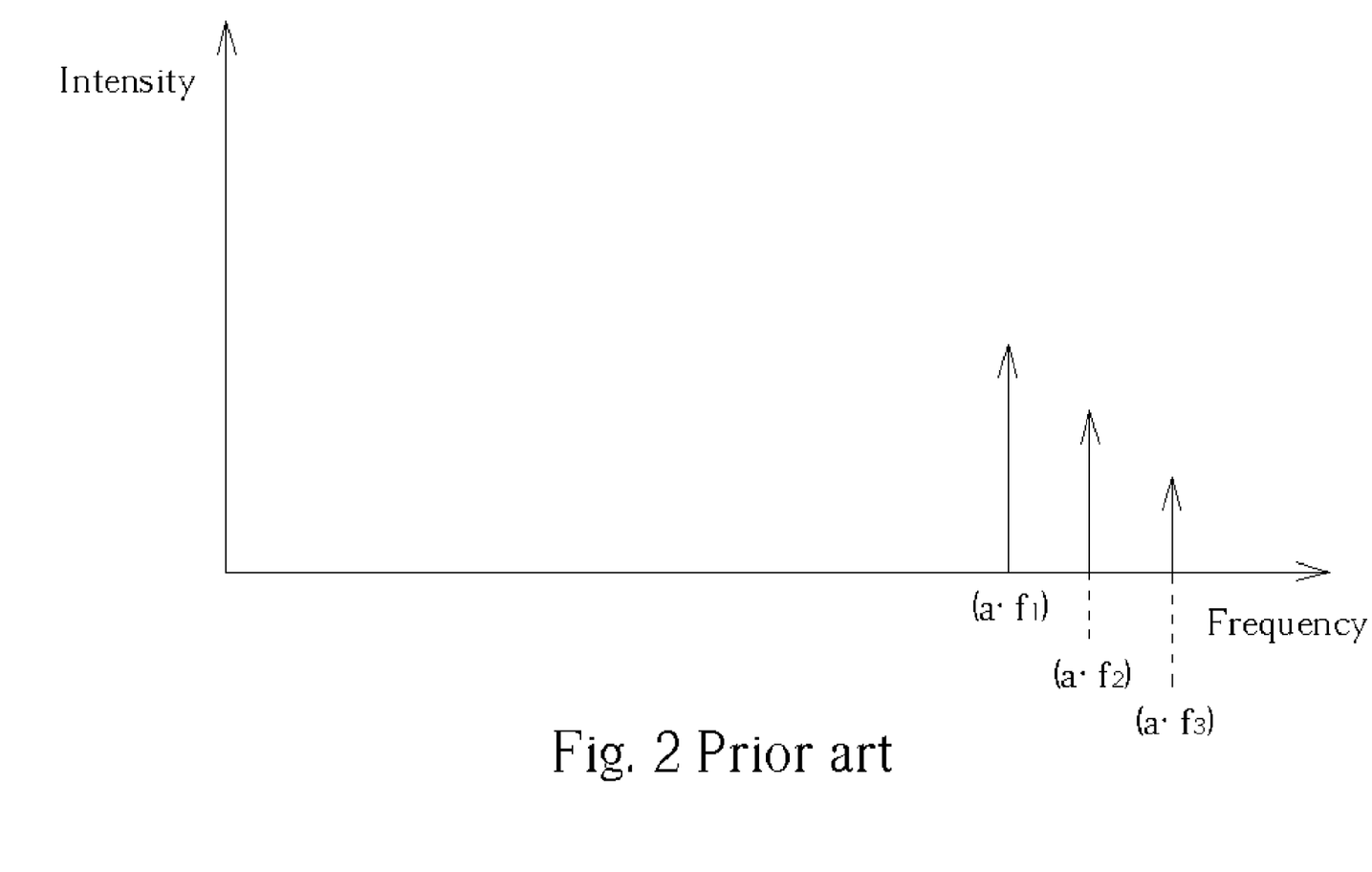
Figure 3:
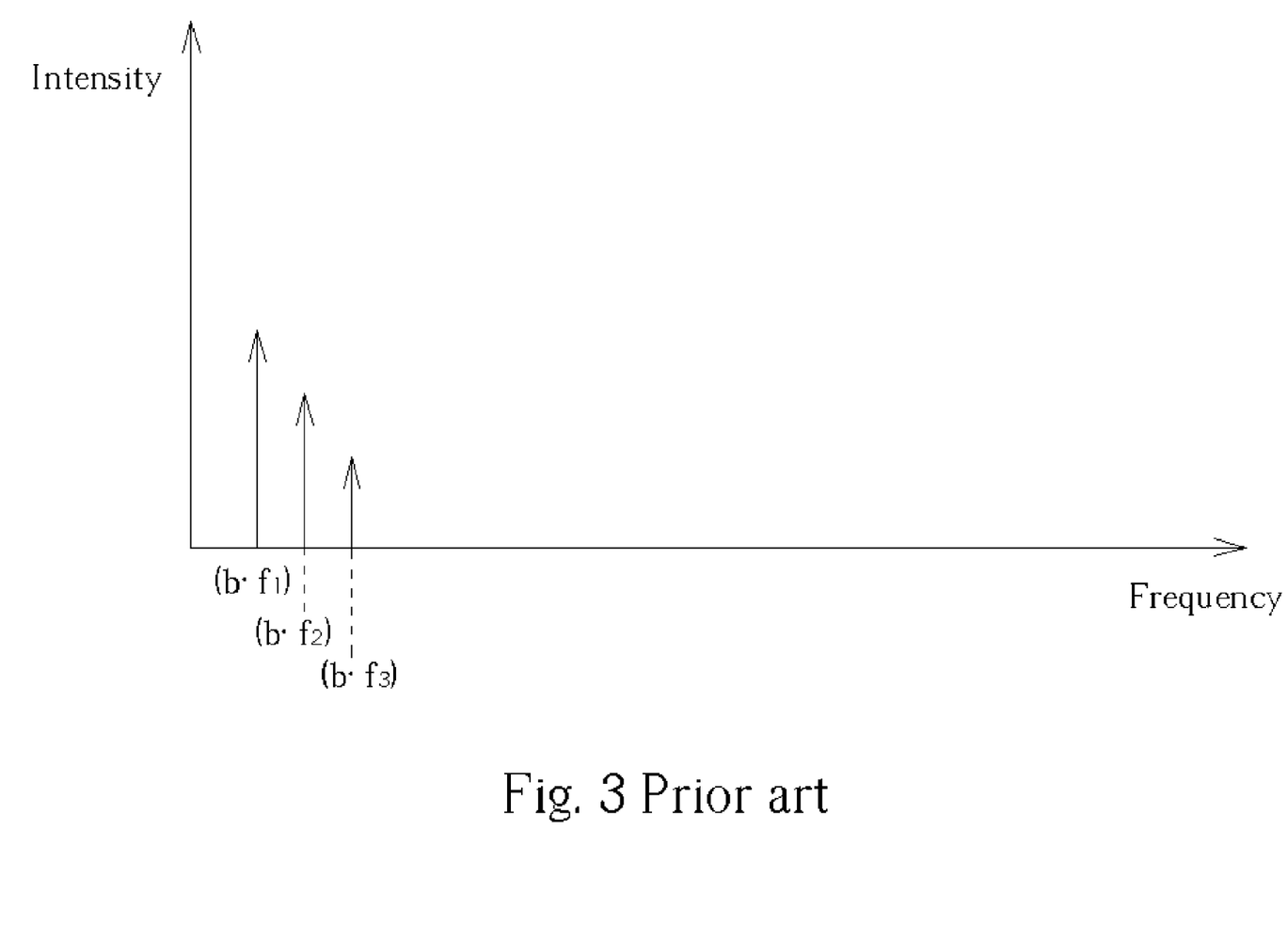

Because vocal ranges of people are different, the conventional accompaniment system has a key shifting function for adjusting the background music to harmonize it with different users. Please refer to FIG. 1, FIG. 2, and FIG. 3, which are schematic diagrams of the key shifting operation according to the prior art. If the background music includes a tone, which is superposed by three continuous signals with different frequencies in the time domain, the tone will separately correspond to frequencies f1, f2, and f3 in the frequency domain, as shown in FIG. 1.

If the first user is female, the tone of the first user will be generally higher. When the key of the background music is too low, the first user must lower her pitch to match the background music. Therefore, the first user can control the key shifting function to raise the key of the background music to match her tone. Please refer to FIG. 2, the original frequencies f1, f2, and f3 of the background music are adjusted with a coefficient "a" (a>1), and the raised frequencies a*f1, a*f2, and a*f3 are higher than the original ones. The first user can utilize the raised background music to sing without flatting the tone, or the first user can even use the key shifting function to raise the key of the background music to exceed her natural vocal range so that the first user can sharpen her tone to harmonize with the raised background music.

On the other hand, if the second user is male, the tone of the second user will be generally deep and suppressed. When the key of the background music is too high, the second user must sharpen the tone to match the background music. Therefore, the second user can control the key shifting function to lower the key of the background music to match his tone. Please refer to FIG. 3, the original frequencies f1, f2, and f3 of the background music are adjusted with a coefficient "b" (b<1), and the lowered frequencies b*f1, b*f2, and b*f3 are lower than the original ones. The second user can utilize the lowered background music to sing without sharpening the tone, or the second user can even use the key shifting function to modify the key of the background music to be lower than his tone so that the second user can flatten his tone to sing with the lowered background music.

There are many different methods to adjust the key of background music. For example, the period of signals of the background music is calculated and then is lengthened or shortened, and the signals with adjusted periods are superposed to complete the key shifting operation. When the user uses the key raising function, the adjusted background music will have more high frequency signals. The excessive frequencies will make the background music unpleasant, and the high frequency noise (produced by the signal source or the key shifting operation) will also disturb the adjusted background music. The conventional accompaniment system, therefore, always utilizes a filter to improve the final quality of the adjusted background music. Because the users can randomly control the key raising or lowering, the accompaniment uses an adaptive filter to adjust the filtering characteristic in accordance with different input data. The adaptive filter must expend much time to automatically adjust the frequency response, so the operation of the conventional adaptive filter is very heavy and complicated.

SUMMARY OF INVENTION

It is therefore a primary objective of the claimed invention to provide a method of setting a transfer function of an adaptive filter to solve the above-mentioned problem.

According to the claimed invention, a method of setting a transfer function of an adaptive filter is disclosed. The adaptive filter is used for processing an audio signal. The method includes setting a first, a second, and a third pole. A first zero is set without resting upon the audio signal. A real part of the first zero is a negative value and an imaginary part of the first zero is a positive value. A second zero is set having a real part corresponding a positive value and an imaginary part corresponding to a negative value. A third zero is set according to a key shifting associated with the audio signal.

The adaptive filter has two fixed zeros symmetrical with the real axis and an adjustable zero on the real axis. Because the position of the adjustable zero can be changed in accordance with the controlling value inputted by the user, the corresponding transfer function of the adaptive filter can be rapidly decided to control the decay of high frequency signals.

These and other objectives of the present invention will no doubt become obvious to those of ordinary skill in the art after reading the following detailed description of the preferred embodiment that is illustrated in the various figures and drawings.

DETAILED DESCRIPTION

Figure 4:
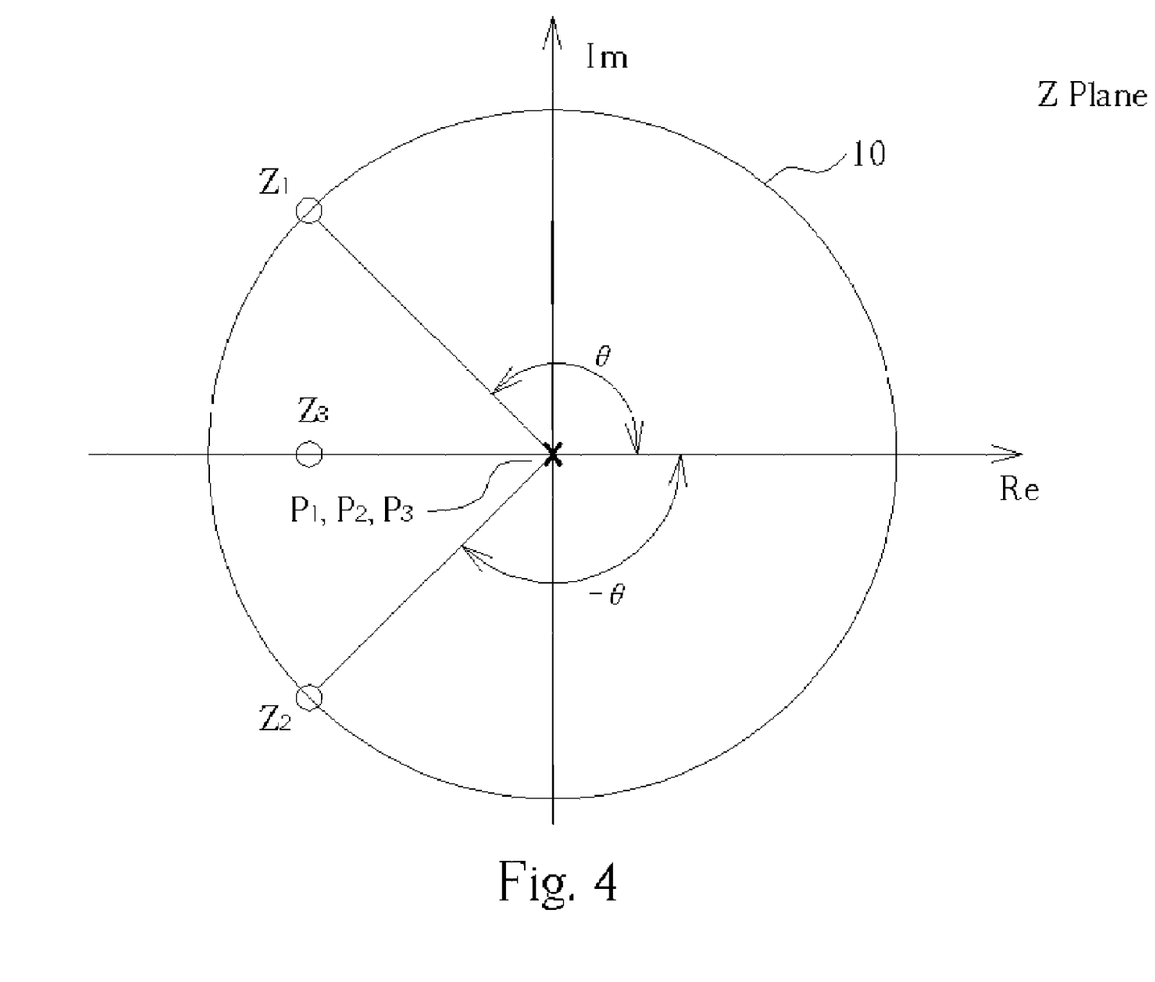
FIG. 4 is a pole-zero plot corresponding to a transfer function on a Z plane of an adaptive filter according to the present invention.

Please refer to FIG. 4, which is a pole-zero plot corresponding to a transfer function on a Z plane of an adaptive filter according to the present invention. In this preferred embodiment, the adaptive filter is one with a third order finite impulse response (FIR). As shown in FIG. 4, the adaptive filter includes three zeros Z1, Z2, and Z3 individually corresponding to $\cos\theta+j\sin\theta$, $\cos\theta-j\sin\theta$, and $-0.8-\Delta Z$, wherein zeros Z1 and Z2 are a pair of complex conjugates symmetrical with the real axis. In addition, the adaptive filter further includes three poles P1, P2, and P3 corresponding to the origin of the Z plane. The transfer function H(Z) of the adaptive filter is expressed as:

$$H(z) = \frac{z-Z1}{z} \times \frac{z-Z2}{z} \times \frac{z-Z3}{z}$$
$$= \frac{z-(\cos\theta + j\sin\theta)}{z} \times \frac{z-(\cos\theta - j\sin\theta)}{z} \times \frac{z-(-0.8-\Delta Z)}{z}$$

In this embodiment, zeros Z1 and Z2 are individually fixed values, and the fixed values are different from the conventional zeros that is produced by dynamically calculating the inputted data. In other words, when operating the claimed adaptive filter, the zeros Z1 and Z2 will not be changed with the inputted data (such as the key shifting operation). The remaining zero Z3 is adjustable according to the control value KEYSHIFT inputted from the user when the user activates the key shifting operation. For example, when the adaptive filter sets two zeros Z1 and Z2 individually corresponding to $\pm(3\pi/4)$ on the Z plane, the accompaniment system provides a key shifting function to match users tone and the user can input a control value KEYSHIFT into the accompaniment system for raising or lowering the key of background music. If the inputted KEYSHIFT is positive, the key raising operation will be started, and if the inputted KEYSHIFT is negative, the key lowering operation will be started. In addition, the absolute value of the control value KEYSHIFT stands for the magnitude of key raising or lowering, so a greater absolute value of the control value KEYSHIFT means a greater impact induced by the enabled key raising or lowering. In regard to the zero Z3, an adjustment value $\Delta Z$ is produced by right shifting the control value KEYSHIFT 6 bits, that is to say, the adjustment value $\Delta Z$ is obtained by dividing the control value KEYSHIFT by $2^6$. Therefore, the value $(-0.8-\Delta Z)$ is a key shifting parameter used for adjusting the zero Z3 of the adaptive filter on the real axis. The transfer function H(Z) of the claimed adaptive filter will be obviously changed after adjusting the position on the Z plane of the zero Z3. The frequency response corresponding to the transfer function H(Z) is also changed, and the relationship between the movement of the zero Z3 and the frequency response of the transfer function H(Z) is described hereinafter.

Figure 5:
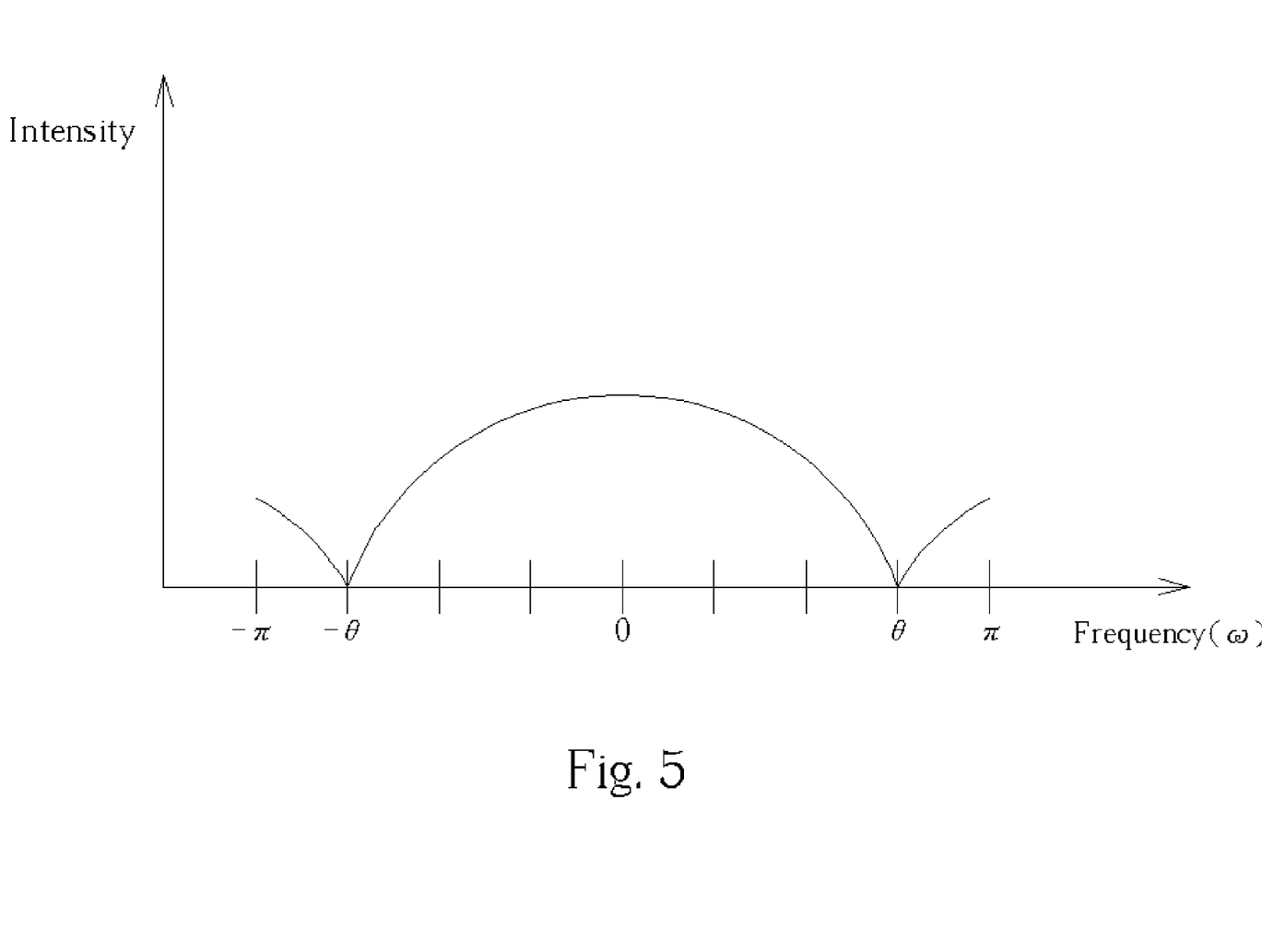
FIGS. 5, 6, and 7 are frequency histograms of a transfer function of an adaptive filter according to the present invention.
Figure 6:
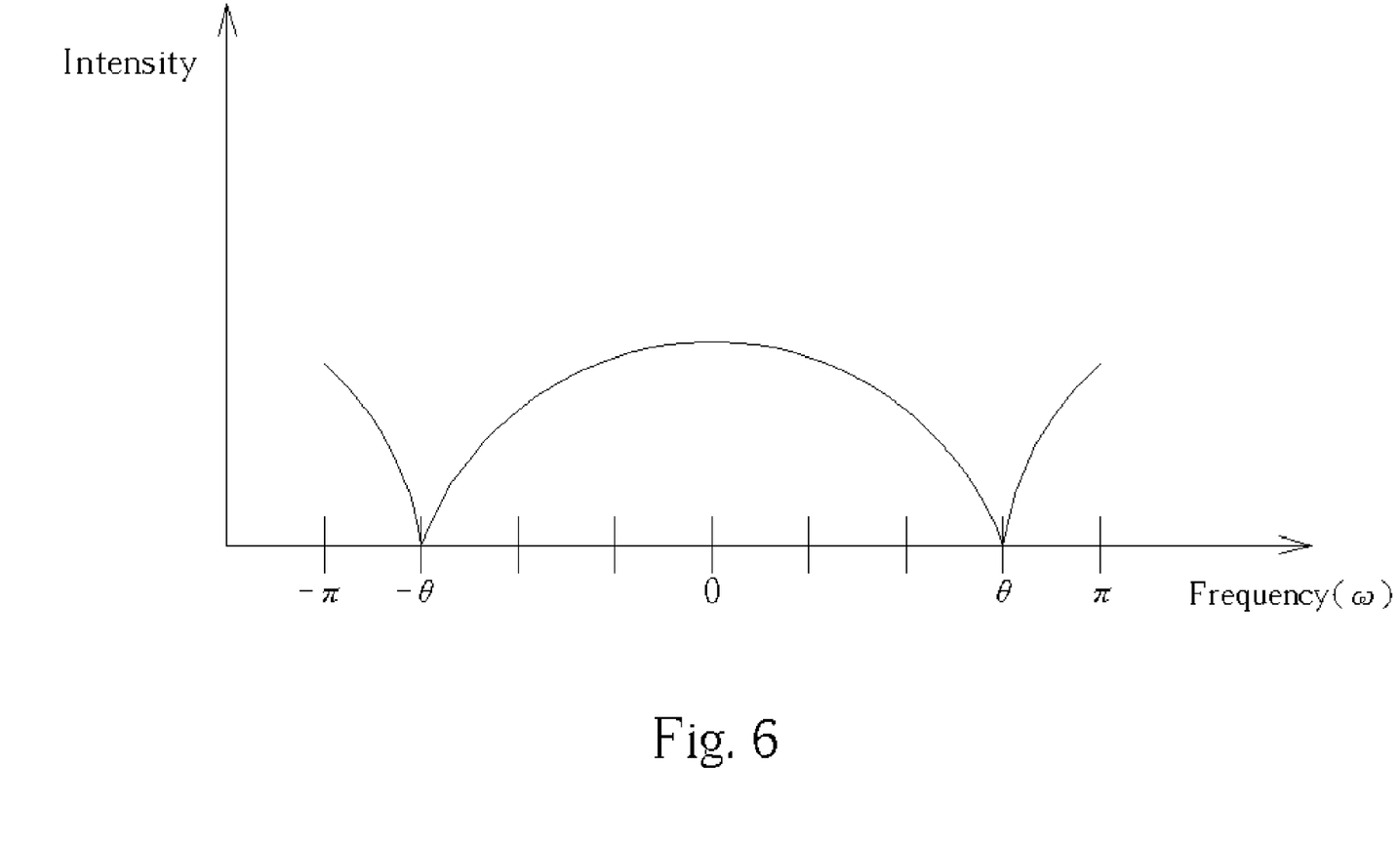
Figure 7:
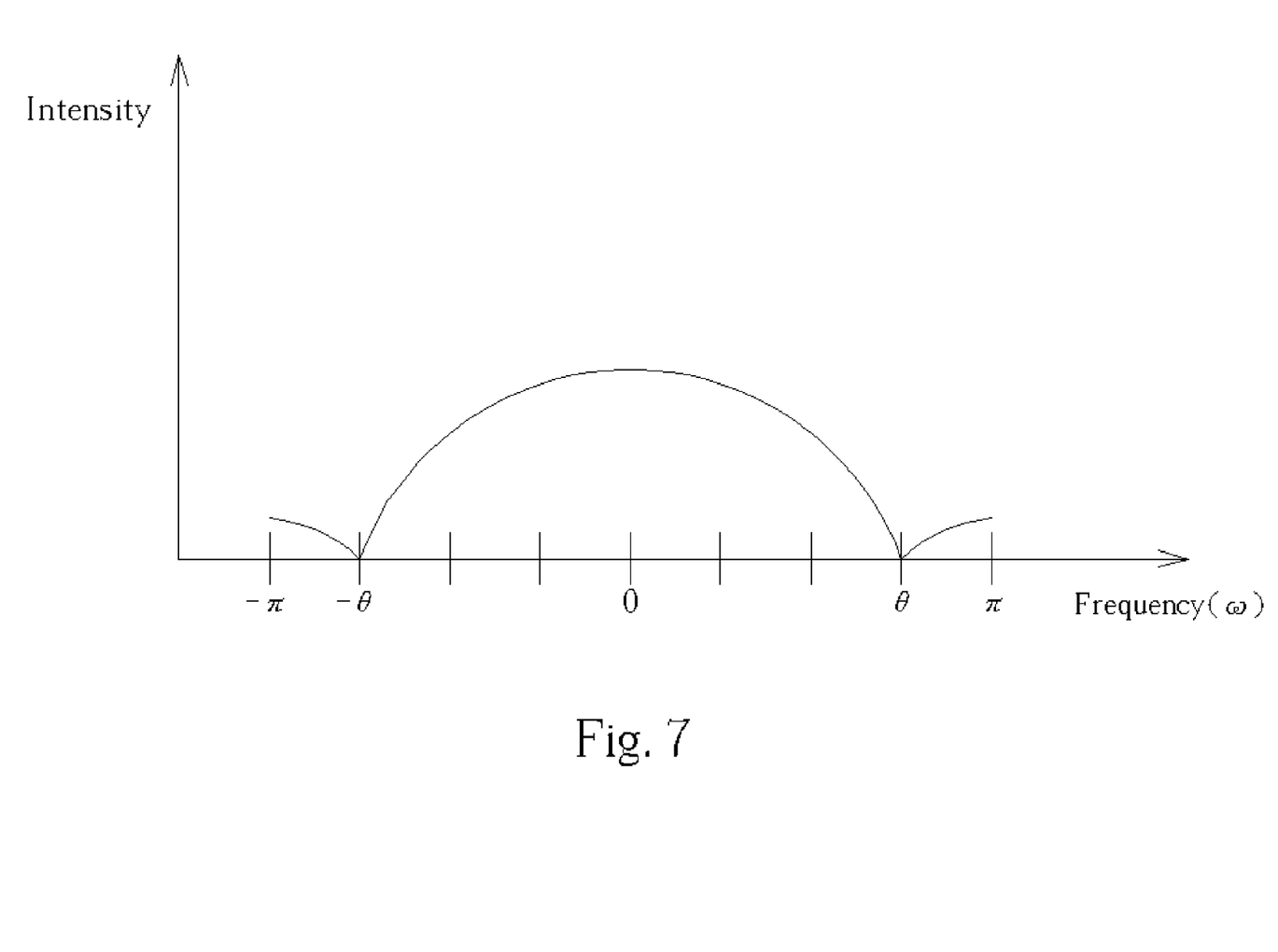

Please refer to FIGS. 5, 6, and 7, which are frequency histograms of the transfer function H(Z). If the user does not start the key shifting operation, the zero Z3 will correspond to 0.8 on the real axis, the frequency θ corresponding to the zero Z1 on the unit circle 10 of the Z plane will be $3\pi/4$, and the frequency θ corresponding to the zero Z2 on the unit circle 10 of the Z plane will be $-3\pi/4$. When the frequency is changed from 0 to $\pi$ along the unit circle 10, the adaptive filter will gradually diminish the inputted data according to the poles P1, P2, P3 and zeros Z1, Z2, Z3 distributed on the Z plane, and the inputted data whose frequency is $\pm 3\pi/4$ will be substantially weakened (as shown in FIG. 5). Similarly, the adaptive filter will also diminish the inputted data whose frequency is $\pi$ according to the poles P1, P2, P3 and zeros Z1, Z2, Z3 distributed on the Z plane (as shown in FIG. 5).

If the user starts the key lowering operation, the control value KEYSHIFT will be negative, that is to say, the zero Z3 will correspond to $-0.8-\Delta Z$ (please note that $\Delta Z$ is negative) on the real axis, and the zero Z3 will diverge from 0.8 and incline to the origin on the real axis. As described above, the frequency θ corresponding to the zero Z1 on the unit circle 10 of the Z plane is $3\pi/4$, and the frequency θ corresponding to the zero Z2 on the unit circle 10 of the Z plane is $-3\pi/4$. When the frequency is changed from 0 to $\pi$ along the unit circle 10, the adaptive filter will gradually diminish the inputted data according to the poles P1, P2, P3 and zeros Z1, Z2, Z3 distributed on the Z plane, and the inputted data whose frequency is $\pm 3\pi/4$ will be substantially weakened (as shown in FIG. 6). Similarly, the adaptive filter will also diminish the inputted data whose frequency is $\pi$ according to the poles P1, P2, P3 and zeros Z1, Z2, Z3 distributed on the Z plane (as shown in FIG. 6).

In comparisons of FIGS. 5 and 6, the zero Z3 is distant from 1 on the real axis after adjustment, so the adaptive filter is equivalent to a low-pass filter and the diminishing effect imposed on the inputted data corresponding to the frequency $\pi$ becomes smaller after adjusting the zero Z3. Because the frequency $\pi$ corresponds to a high frequency, the background music will be composed of more low frequency signals after the key lowering operation. The adaptive filter can still retain some high frequency signals to keep the quality of the background music great. Obviously, if the magnitude of the key lowering operation is larger, the diminishing effect imposed on the inputted data corresponding to the frequency $\pi$ will be smaller and more high frequency signals will be retained.

On the other hand, when the user starts the key raising operation, the control value KEYSHIFT will be positive, that is to say, the zero Z3 will correspond to $-0.8-\Delta Z$ (please note that $\Delta Z$ is positive) on the real axis, and the zero Z3 will diverge from 0.8 and incline to $-1$ on the real axis. As mentioned above, the frequency θ corresponding to the zero Z1 on the unit circle 10 of the Z plane is $3\pi/4$, and the frequency θ corresponding to the zero Z2 on the unit circle 10 of the Z plane is $-3\pi/4$. When the frequency is changed from 0 to $\pi$ along the unit circle 10, the adaptive filter will gradually diminish the inputted data according to the poles P1, P2, P3 and zeros Z1, Z2, Z3 distributed on the Z plane, and the inputted data whose frequency is $\pm 3\pi/4$ will be substantially weakened (as shown in FIG. 7). Similarly, the adaptive filter will also diminish the inputted data whose frequency is $\pi$ according to the poles P1, P2, P3 and zeros Z1, Z2, Z3 distributed on the Z plane (as shown in FIG. 7).

In comparison of FIGS. 5 and 7, the zero Z3 is inclined to 1 on the real axis after adjustment, so the diminishing effect imposed on the inputted data corresponding to the frequency $\pi$ becomes larger after adjusting the zero Z3. Because the frequency $\pi$ corresponds to a high frequency, the interference of high frequency will worsen the quality of background music. After the user starts the key raising operation, the background music will be composed of more high frequency signals. The adaptive filter can filter out more high frequency signals (including the high frequency noise) to keep the quality of the background music great. Obviously, if the magnitude of key raising operation is larger, the diminishing effect imposed on the inputted data corresponding to the frequency $\pi$ will be also larger and more high frequency signals will be filtered out.

In contrast to the prior art, the present adaptive filter is a third order filter having two fixed zeros symmetrical with the real axis and an adjustable zero on the real axis. The position of the adjustable zero can be changed in accordance with the controlling value inputted by the user, so the corresponding transfer function of the adaptive filter can be rapidly decided to control the decay of high frequency signals. When the user starts the key raising operation, the adaptive filter can diminish more high frequency signals through setting the adjustable zero, and when the user starts the key lowering operation, the adaptive filter can retain more high frequency signals through setting the adjustable zero. In conclusion, the present adaptive filter can improve the quality of background music after the key shifting operation, and can rapidly calculate the inputted data to improve the efficiency.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of setting a transfer function of an adaptive filter, the adaptive filter being used for processing an audio signal, the method comprises:
   (a) setting a first, a second, and a third pole of the adaptive filter;
   (b) setting a first zero of the adaptive filter without resting upon the audio signal, wherein a real part of the first zero is a negative value and an imaginary part of the first zero is a positive value;
   (c) setting a second zero of the adaptive filter having a real part corresponding a positive value and an imaginary part corresponding to a negative value;
   (d) setting a third zero of the adaptive filter according to a key shifting associated with the audio signal; and
   (e) filtering the audio signal with the adaptive filter to produce a filtered audio signal.

2. The method of claim 1, wherein the first, the second, and the third poles all correspond to a zero value.

3. The method of claim 1, wherein the third zero corresponds to a real negative value.

4. The method of claim 3, wherein the third zero is adjusted to increase its absolute value while key of the audio signal is sharpened.

5. The method of claim 3, wherein the third zero is adjusted to decrease its absolute value while key of the audio signal is flattened.

6. The method of claim 1, wherein the first and the second zeros are a pair of complex conjugates.

7. The method of claim 1, wherein the adaptive filter is a low-pass filter.

8. The method of claim 1, wherein in step (c), the second zero is set without resting upon the audio signal.

* * * * *